US006458718B1

(12) United States Patent
Todd

(10) Patent No.: US 6,458,718 B1
(45) Date of Patent: Oct. 1, 2002

(54) FLUORINE-CONTAINING MATERIALS AND PROCESSES

(75) Inventor: Michael A. Todd, Phoenix, AZ (US)

(73) Assignee: ASM Japan K.K. (JP)

( * ) Notice: Subject to any disclaimer, the term of this patent is extended or adjusted under 35 U.S.C. 154(b) by 0 days.

(21) Appl. No.: 09/841,525

(22) Filed: Apr. 24, 2001

Related U.S. Application Data

(60) Provisional application No. 60/200,674, filed on Apr. 28, 2000.

(51) Int. Cl.$^7$ .............................................. H01L 21/469
(52) U.S. Cl. ....................................................... 438/778
(58) Field of Search ................................ 438/758, 773, 438/774, 778, 780, 789, 790

(56) References Cited

U.S. PATENT DOCUMENTS

| 4,781,942 A | 11/1988 | Leyden et al. |
| 5,244,698 A | 9/1993 | Iishihara et al. |
| 5,563,105 A | 10/1996 | Dobuzinsky et al. |
| 5,703,404 A | 12/1997 | Matsuura |
| 5,876,798 A | 3/1999 | Vassiliev |
| 5,900,290 A | 5/1999 | Yang et al. |
| 5,989,998 A | 11/1999 | Sugahara et al. |
| 6,051,321 A | 4/2000 | Lee et al. |
| 6,068,884 A | 5/2000 | Rose et al. |
| 6,365,528 B1 * | 4/2002 | Sukharev et al. ............ 438/778 |

FOREIGN PATENT DOCUMENTS

| EP | 0 367 004 B1 | 12/1993 |
| WO | WO 99/55526 | 11/1999 |

OTHER PUBLICATIONS

Bayer et al., *Overall kinetics of SiOx remote–PECVD using different organosilicon monomers*, Surface and Coatings Technology, 116–119 (1999) 874–878.

Fonseca et al., *Plasma Polymerization of Tetramethylsilane*, Chem Mater, 1993, 5, 1676–1682.

Shirafuji et al., *PE–CVD of Fluorocarbon/SiO composite thin films using C4F8 and HMDSO1*, Plasmas and Polymers, vol. 4, No. 1, 1999, pp. 57–75.

Shirafuji et al., *PE–CVD of fluorocarbon/silicon oxide composite thin films from TFE and HMDSO*, Mat. Res. Soc. Symp. Proc. vol. 544, pp. 173–178.

Shirafuji et al., *Plasma copolymerization of tetrafluoroethylene/hexamethyldisiloxane and In Situ Fourier Transform infrared spectroscopy of its gas phase*, Jpn. J. Appl. Phys. vol. 38 (1999) pp. 4520–4526.

Sugahara et al., *Low Dielectric constant carbon containing SiO2 films deposited by PECVD technique using a novel CVD precursor*, DUMIC Conference, Feb. 10–11, 1997, pp. 19–25.

Thomas et al., *Plasma etching and surface analysis of a SiC:H films deposited by low temperature plasma enhanced chemical vapor deposition*, Mat. Res. Soc. Symp. Proc. vol. 334, 1994, pp. 445–450.

IBanerjee, I. et al., Characterization of Chemical Vapor Deposited Amorphous Flourphous Flourocarbons for Low Dielectric Constant Interlayer Dielectrics. J. Electrochem. Soc., vol. 146(6), p. 2219 (1999).

Han, S. et al., *Deposition of Fluorinated Amorphous Carbon Thin Films as a Low–Dielectric Constant Material*. J. Electrochem. Soc., vol. 146(9), p. 3383 (1999).

Limb, Scott J., et al., *Growth of fluorocarbon polymer thin films with high $CF^2$ fractions and low dangling bond concentrations by thermal chemical vapor deposition*, Appl. Phys Lett., vol. 68(20), p. 2810 (1996).

Sharp, K.G., et al., *Synthesis and Some Properties of Trifluoro(trifluoromethyl)silane*, J. Fluorine Chem., vol. 1, pp. 249–251 (1971/1972).

Washburne, Stephen S. et al., *Chloraminosilanes: I. the Preparation of Chloro(dimethylamino)hydrogen Silanes*, Inorg. Nucl. Chem. Letters vol. 5, pp. 17–19 (1969), Pergamon Press, Great Britain.

Bhushan, B., *Researchers Pioneer Techniques to Lubricate Microdevices*, Research Communications, Mar. 30, 2001.

Sharp, K.G. et al., *Perfluror(alkylsilanes). II. Trifluoromethyl)silane and Trifluoro(pentafluoroethyl)silane[1]*, Inorganic Chemistry, vol. 11, No. 6, 1972, pp. 1259–1264.

Savage, Charles R. et al., *Spectroscopic Characterization of Films Obtained in Pulsed Radio–Frequency Plasma Discharges of Fluorocarbon Monomers*, American Chemical Society, pp. 745–768.

Labelle, Catherine B., et al., "Electron spin resonance of pulsed plasma–enchanced chemical vapor deposited fluorocarbon films", J. Appl. Phys. 82(4), Aug. 15, American Institute of Physics, 1997, pp. 1784–1787.

Labelle Catherine B., et al., "Preliminary Electrical Characterization of Pulsed–Plasma Enhanced Chemical Vapor Deposited Teflon–like Thin Films", Mat. Res. Soc. Symp. Proc. vol. 443, Materials Research Society, 1997, pp. 188–195.

* cited by examiner

Primary Examiner—Michael Sherry
Assistant Examiner—Lisa Kilday
(74) Attorney, Agent, or Firm—Knobbe, Martens, Olson & Bear, LLP

(57) ABSTRACT

Chemical precursors that contain carbon atoms and fluorine atoms can be activated under a variety of conditions to deposit fluorine-containing materials. Chemical precursors of the formula $(F_3C)_{4-m-n}MX_mR_n$, are preferred, wherein M is Si or Ge; X is halogen; R is H or D; m is 0, 1, 2 or 3; and n is 0, 1, 2, or 3; with the proviso that $(m+n) \leq 3$.

47 Claims, No Drawings

FLUORINE-CONTAINING MATERIALS AND PROCESSES

RELATED APPLICATION INFORMATION

This application claims priority under 35 U.S.C. §119(e) to U.S. provisional application Ser. No. 60/200,674, filed Apr. 28, 2000, which is incorporated herein by reference in its entirety.

BACKGROUND OF THE INVENTION

1. Field of the Invention

This invention relates generally to methods for making fluorine-containing materials, and more particularly to methods for depositing such materials onto substrates using chemicals that contain carbon atoms and fluorine atoms.

2. Description of the Related Art

As the dimensions of microelectronic devices become smaller, the importance of the physical properties of the materials used in their manufacture becomes more important. This is particularly true of the dielectric materials that are used to insulate metal lines and vias from one another because of the contributions to parasitic capacitance across insulators between closely spaced conductors. Silicon dioxide has been employed within the industry as a dielectric material for the manufacture of devices for nearly three decades, but may become less suitable in the future because of its relatively high dielectric constant (k~4.1).

A number of fluorinated materials have been studied as possible replacements for silicon dioxide. U.S. Pat. No. 5,563,105 discloses a chemical vapor deposition (CVD) process employing $SiF_4$ and tetraethoxysilane (TEOS) to form a fluorosilicate glass, which is stated to have lower water absorption than a sample formed from $C_2F_6$. U.S. Pat. No. 5,703,404 discloses silicon oxide films containing Si-F bonds through the use of fluorosilanes. U.S. Pat. No. 5,876,798 discloses the use of fluorotriethoxysilane (FTES). U.S. Pat. No. 5,244,698 discloses PECVD deposition using organosilanes and organohalogenosilanes. The use of fluorinated compounds containing carbon-carbon double bonds is disclosed in U.S. Pat. Nos. 5,989,998. 6,051,321 discloses the use of fluorinated aromatic compounds. U.S. Pat. No. 5,900,290 discloses the use of octafluorocyclobutane, as does T. Shirafuji et al., "PE-CVD of Fluorocarbon/SiO Composite Thin Films Using $C_4F_8$ and HMDSO," Plasmas and Polymers, Vol. 4, No. 1, p. 57 (1999). Other references in this regard are Indrajit Banerjee, et. al., "Characterization of Chemical Vapor Deposited Amorphous Fluorocarbons for Low Dielectric Constant Interlayer Dielectrics." J. Electrochem. Soc., Vol. 146(6), p. 2219 (1999); C. B. Labelle, et. al., DUMIC, pg. 1998 (1997); Sang-Soo Han, et. al., "Deposition of Fluorinated Amorphous Carbon Thin Films as a Low-Dielectric Constant Material." J. Electrochem. Soc., Vol. 146(9), p. 3383 (1999); and Scott J. Limb, "Growth of fluorocarbon polymer thin films with high $CF_2$ fractions and low dangling bond concentrations by thermal chemical vapor deposition," Appl. Phys. Lett., Vol. 68(20), p. 2810 (1996).

Spin-on processes are also known for making low-k films. These processes generally involve dissolving or dispersing a low-k polymer in a solvent to form a liquid coating mixture, depositing the coating mixture onto a substrate, spinning the substrate to create a uniform coating, then drying the coating to remove the solvent. Another known method for reducing the dielectric constant of a film is to introduce porosity into the film.

A wide variety of fluorinated polymers such as polytetrafluoroethylene (PTFE) are known. PTFE materials generally have low dielectric constants but are structurally based upon long, uncrosslinked chains. The uncrosslinked structure of these materials is likely the source of the mechanical instabilities that have been observed during attempts to integrate them into microelectronic devices. Current spin-on processes face a serious challenge in attempting to crosslink PTFE because they are typically produced using nanoemulsions of PTFE particles that are delivered to the substrate in solution. These particles are typically five to twenty nanometers in size and thus represent relatively large building blocks for the deposition of thin film materials, resulting in problems with step coverage. Furthermore, because these films are formed from particles, they often require adhesion promoters to obtain adherent films. Current CVD PTFE materials are typically deposited using plasma-enhanced chemical vapor deposition (PECVD) of mixtures of $CF_4$ and $CH_4$. It is believed that the deposited materials result from reactive C-F species derived from partially ionized source gas molecules. Typical C-F species are believed to be $CF_4^+$, $CF_3^+$, $CF_2^{2+}$ and very limited amounts of $CF^{3+}$, and thus represent a broad range of source species for the deposition of the film. Coupled with ion bombardment of the depositing film, this can lead to non-homogeneous film composition and properties, including dangling bonds, as well as to the incorporation of undesirable impurities within the depositing film. Furthermore, because of the charged nature of the species being used to deposit these materials, gap-filling of dimensionally small, high aspect ratio structures can be poor and loading effects between large and small open areas on the wafer surface can be problematic.

There remains a need for fluorinated materials such as low-k films having better properties more suitable for use in microelectronics manufacturing, and for processes for producing such films that can be readily integrated into fabrication process flows.

SUMMARY OF THE INVENTION

The inventor has discovered better ways to make fluorinated materials. In preferred embodiments, these fluorinated materials have a low dielectric constant suitable for use in microelectronics manufacturing. In one aspect, chemical precursors that contain one or more —$CF_3$ (trifluoromethyl) groups are disclosed, and processes for using these precursors to deposit fluorine-containing materials onto substrates are taught. In another aspect, mixtures of chemical precursors with sources of various elements are used to deposit fluorine-containing materials onto substrates. In yet another aspect, processes for making porous fluorinated materials are taught.

In one embodiment, a process is provided for depositing a material onto a surface, comprising providing a substrate; providing a chemical precursor of the formula $(F_3C)_{4-m-n}MX_mR_n$, wherein M is Si or Ge; X is halogen; R is H or D; m is 0, 1, 2 or 3; and n is 0, 1, 2, or 3; with the proviso that $(m+n) \leq 3$; and activating the chemical precursor to thereby deposit a fluorine-containing material onto the substrate.

In another embodiment, a chemical vapor deposition process is provided for depositing a dielectric film onto a surface, comprising providing a chemical vapor deposition chamber having disposed therein a substrate; introducing a gas to the chamber, wherein the gas comprises a chemical precursor selected from the group consisting of $(F_3C)SiH_3$, $(F_3C)_2SiH_2$, $(F_3C)SiD_3$, $(F_3C)_2SiD_2$, $(F_3C)SiF_2H$, $(F_3C)SiF_3$, $(F_3C)SiFD_2$, and $(F_3C)SiF_2D$; and reacting the chemical precursor to deposit onto the substrate a film having a dielectric constant of about 2.7 or lower.

In yet another embodiment, a process for making a porous material is provided, comprising providing an oxygen source; providing a compound of the formula $(F_3C)_{4-m-n}MX_mR_n$, wherein M is Si or Ge; X is halogen; R is H or D; m is 0, 1, 2 or 3; and n is 0, 1, 2, or 3; with the proviso that $(m+n) \leq 3$; providing a substrate; activating the oxygen source and the compound at a temperature of about 300° C. or less to thereby deposit an oxygen-containing film onto the substrate; and heating the oxygen-containing film to a temperature in the range of about 150° C. to about 400° C. to form a porous film.

These and other embodiments are described in greater detail below.

DETAILED DESCRIPTION OF THE PREFERRED EMBODIMENTS

A wide variety of fluorine-containing materials can be prepared by practicing the processes described herein. "Fluorine-containing material" is used in its usual sense to include materials that contain the element fluorine as part of their chemical structure. The fluorine atoms can be incorporated into the material in various ways, preferably by ionic or covalent bonds, and can be dispersed homogeneously or non-homogeneously. Preferably, fluorine-containing materials are organic polymers in which fluorine atoms are bonded to carbon atoms. The fluorine-containing material is preferably a polymer that comprises recurring $CF_2$ units and may be branched or unbranched, and crosslinked or uncrosslinked, preferably crosslinked.

Fluorine-containing materials can be in various forms such as particles or fibers, but are preferably in the form of a film. "Film" is used in its usual sense to include both free-standing films and layers or coatings applied to substrates. A film can be flat or it can conform to an underlying three-dimensional surface, and in either case can have a constant or variable thickness, preferably constant. Preferably, the average thickness of the film is effective to provide the desired function, e.g. low dielectric constant for intermetal level dielectric applications. Frequently, the average film thickness is in the range of about 5 Å to about 15,000 Å, preferably about 10 Å to about 10,000 Å, more preferably about 10 Å to about 8,000 Å, most preferably about 100 Å to about 5,000 Å.

The fluorine-containing materials described herein are preferably deposited onto a substrate. "Substrate" is used in its usual sense to include any underlying surface onto which the fluorine-containing material is deposited or applied. Preferred substrates can be made of virtually any material, including without limitation metal, metal oxide, metal nitride, silicon, germanium, plastic, and/or glass, preferably silicon and silicon alloys.

Particularly preferred substrates include silicon substrates, e.g. silicon wafers and layers of Group III–V materials used in the fabrication of microelectronics, and integrated circuits. "Integrated circuit" is used in its usual sense in the microelectronics field to include substrates onto which microelectronic devices have been or are to be applied, and thus includes integrated circuits which are in the process of being manufactured and which may not yet be functional. In the field of integrated circuit fabrication, the semiconductor substrate generally refers to the lowest level of semiconductor material from which devices are formed.

For microelectronic applications, fluorine-containing materials are preferably dielectric films. "Dielectric film" is used in its usual sense in the microelectronics field to mean films having the structure described above and having an insulating electrical function in the completed circuit. Preferred dielectric films have a dielectric constant of about 3.0 or less, more preferably about 2.7 or less, even more preferably about 2.4 or less, most preferably about 2.2 or less.

Other preferred substrates are the surfaces of moving parts in microelectromechanical systems (MEMS). The fluorine-containing materials described herein can be used to reduce friction in various MEMS applications, including without limitation nanometer-sized bearings, gears and motors. For MEMS applications, the fluorine-containing material is preferably a film having a thickness in the range of about 5 Å to about 25 Å. Preferably, the MEMS device is fabricated using integrated circuit process technology.

For low-friction applications such as coating moving parts, the static coefficient of friction for a fluorine-containing material, as measured in contact with itself, is preferably about 0.5 or less, more preferably about 0.2 or less, most preferably about 0.1 or less. As used herein, the "static coefficient of friction" between two surfaces is the ratio of the force required to move one over the other to the force pressing the two together. If F is the force required to move one surface over another and W is the force pressing the surfaces together, the coefficient of friction $\mu=F/W$.

Various processes utilizing the chemical precursors described herein may be used to deposit fluorine-containing materials. As used herein, a "chemical precursor" is a fluorine-containing ("F-containing") chemical compound or mixture of F-containing chemical compounds that is capable of being activated under the conditions described herein to form a fluorine-containing material. Preferred processes involve providing a substrate and providing a chemical precursor that contains fluorine atoms and carbon atoms under conditions that are effective to deposit a fluorine-containing material onto the substrate. Preferred chemical precursors are capable of being activated to yield F-containing molecular fragments that result in a film and other gaseous molecular fragments that can be removed from the vicinity of the substrate to minimize contamination of the film.

Preferred chemical precursors contain at least one trifluoromethyl group. A preferred class of trifluoromethyl-containing chemical precursors is represented by the chemical formula $(F_3C)_{4-m-n}MX_mR_n$, wherein M is Si or Ge; X is halogen; R is H or D; m is 0, 1, 2 or 3; and n is 0, 1, 2, or 3; with the proviso that (m+n) is less than or equal to three. Preferably, M is Si and X is fluorine or chlorine. Preferably, (m+n)=2 or 3 because such chemical precursors tend to have greater thermal stability than those in which (m+n)=0 or 1.

Activating the chemical precursors disclosed herein is believed to result in the formation of chemically active F-containing species that are capable of depositing onto a substrate to form a fluorine-containing material. As used herein, "activating" a chemical precursor means causing the chemical precursor to become so chemically active as to enable deposition on a substrate to form a fluorine-containing material. Reacting a chemical precursor under the conditions described herein deposits the corresponding fluorine-containing material. Various preferred ways of activating the chemical precursor are discussed below.

The instant invention is not bound by theory, but it is believed that activating the chemical precursors described herein involves creating chemically active F-containing fragments, preferably fragments that contain carbon and fluorine atoms. These reactive fragments can then combine to form a fluorine-containing material. Under preferred conditions, a fluorine-containing material is formed by activating a chemical precursor represented by the formula $(F_3C)_{4-m-n}MX_mR_n$ to form $CF_2$-type fragments and gaseous F-MXR-type fragments. Preferred silicon-containing ("Si-containing") chemical precursors include $(F_3C)SiH_3$, $(F_3C)_2SiH_2$, $(F_3C)SiD_3$, $(F_3C)_2SiD_2$, $(F_3C)SiFH_2$, $(F_3C)SiF_2H$, $(F_3C)SiF_3$, $(F_3C)SiFD_2$, $(F_3C)SiF_2D$, $(F_3C)SiClF_2$, $(F_3C)SiCl_2F$, and $(F_3C)SiCl_3$. Another preferred chemical precursor is hexafluoropropylene oxide, which upon activation is believed to form $CF_2$-type fragments and trifluoromethylacetyl fluoride. Preferred germanium-containing ("Ge-containing") chemical precursors include $(F_3C)GeH_3$, $(F_3C)_2GeH_2$, $(F_3C)GeD_3$, $(F_3C)_2GeD_2$, $(F_3C)GeFH_2$, $(F_3C)GeF_2H$, $(F_3C)GeF_3$, $(F_3C)GeFD_2$, and $(F_3C)GeF_2D$.

An example of a possible activation and deposition pathway is illustrated in Scheme (I) for $(F_3C)SiF_3$, a highly preferred chemical precursor:

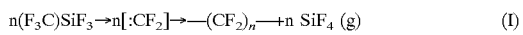

$$n(F_3C)SiF_3 \rightarrow n[:CF_2] \rightarrow -(CF_2)_n- + n\ SiF_4\ (g) \qquad (I)$$

The "$[:CF_2]$" in Scheme (I) represents highly reactive $:CF_2$ fragments and other F-containing fragments that may also be generated; the brackets indicate that these species are likely to be transient and short-lived. The "$-(CF_2)_n-$" in Scheme (I) represents a possible structure for at least a part of the fluorinated polymer formed by the deposition of the postulated $:CF_2$ fragments. Activation and deposition are preferably conducted under conditions such that any by-products, e.g., $SiF_4$, are gaseous in order to minimize contamination of the fluorine-containing material with silicon or fluorine (unless inclusion of those elements is desired). Some $[:CF_2]$ species may react together to form other by-product species such as tetrafluoroethylene (not shown in Scheme (I)), in which case these by-products are preferably gaseous also. Fluorine-containing copolymers can be prepared by using mixtures of chemical precursors.

Chemical precursors can be prepared by methods known to those skilled in the art. For example, syntheses for preferred chemical precursors are disclosed in the literature, see, e.g., K. G. Sharp and T. D. Coyle, "Synthesis and Some Properties of Trifluoro(trifluoromethyl)silane," J. Fluorine Chem., Vol. 1, pp. 249–251 (1971/72); H. Beckers et al., "Synthesis and Properties of (Trifluoromethyl) trichlorosilane, a Versatile Precursor for $CF_3Si$ Compounds," J. Organometal. Chem., Vol. 316, pp. 41–50, (1986). These literature articles are incorporated herein by reference in their entireties for the express purpose of describing the syntheses of these precursors. Preferably, the synthetic methods disclosed in these articles are modified by reacting $[(H_3C)_2N]_2Si(H)CF_3$ and HCl for twenty four hours to maximize the yield of $CF_3SiCl_3$, as shorter reaction times yield primarily $CF_3Si(H)Cl_2$. Furthermore, the amount of excess $SbF_3$ utilized in the synthesis of $CF_3SiF_3$ from $CF_3SiCl_3$, as well as the total reaction time, are preferably varied to maximize the yield of $CF_3SiF_3$.

It is preferable to provide a chemical precursor that is relatively stable and activate it for deposition. Activating the chemical precursor preferably involves applying amounts of energy, e.g., thermal, chemical, photo-chemical, mechanical, or plasma energy, that are effective to break one or more chemical bonds within the chemical precursor. It is often difficult to store the resulting F-containing fragments for extended periods of time because they tend to be highly reactive. Therefore, it is preferable to activate the chemical precursor in close spatial proximity to the substrate, at the time of deposition.

The process of activating the chemical precursor is believed to involve the formation of F-containing fragments as discussed above, but the detection, measurement and/or characterization of these fragments may be difficult in practice because of their transient nature. Activation of the chemical precursor is thus primarily evidenced by the formation of a fluorine-containing material and does not require formation or identification of any F-containing fragments, although evidence of fragmentation may be indicative of activation.

The chemical precursor can be provided in the form of a solid, liquid or gas, preferably a gas. A liquid comprised of the chemical precursor can be applied to a substrate and then activated to form a fluorine-containing material on the substrate, preferably by using techniques similar to those that are well-known in the art for spin-coating. Preferably, the chemical precursor is provided in the form of a gas. The amount of chemical precursor provided is preferably controlled by adjusting the pressure of the gas, which can range from about 0.01 torr to atmospheric pressure (about 760 torr) or even higher. The amount can also be controlled by intermixing the chemical precursor with another gas and adjusting the total gas pressure or the partial pressure of the chemical precursor in the gas mixture. Optional components of the gas mixture include carrier gases such as hydrogen, helium, nitrogen, argon, neon, krypton and xenon. A liquid chemical precursor can be provided by using a bubbler, e.g., by bubbling a carrier gas through the chemical precursor. The amount of chemical precursor in the gas can vary over a broad range, preferably from about 0.01% to 100% by volume.

For many end-use applications it may be desirable to adjust the overall elemental composition of the fluorine-containing material by including additional elements, and/or by adding additional amounts of fluorine and/or carbon. Supplemental elements can be incorporated for variety of reasons, e.g., to introduce crosslinking sites, to adjust the dielectric constant, to increase porosity, and to modify adhesion to substrates and/or subsequently deposited layers, as discussed below.

The incorporation of additional elements into the fluorine-containing material may be accomplished by providing a supplemental source of the additional element or elements, preferably by providing a supplemental silicon source, oxygen source, germanium source, and/or carbon source. Two or more supplemental sources may be provided, preferably a mixture of an oxygen source and a silicon source, or a mixture of an oxygen source and a germanium source. When the chemical precursor is applied to the substrate in the form of a liquid, the liquid can also comprise a supplemental source of the desired additional element, in an amount effective to provide the resulting fluorine-containing material with the desired elemental composition. Preferably, a gas is provided which comprises the chemical precursor and the supplemental source, and the amount of each element in the resulting fluorine-containing material is controlled by adjusting the partial pressure of each component using routine experimentation. Schemes (II) and (III) illustrate preferred possible pathways for incorporating silicon into the fluorine-containing material.

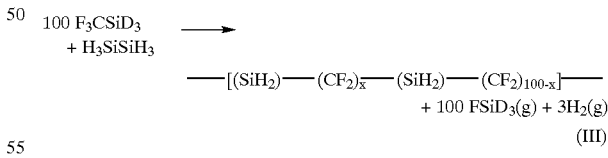

(II)

(III)

The ratios of $F_3CSiD_3$ to $H_3SiSiH_3$ and $F_3CSiH_3$ to $(H_3C)_2SiH_2$ illustrated in Schemes (II) and (III), respectively, are only exemplary and can be varied over a broad range. Preferably, the ratio of chemical precursor to supplemental source, i.e., chemical precursor:supplemental source, is about 10:1 or higher, more preferably in the range of about 50:1 to about 50,000:1, by mole. The properties of the fluorine-containing material can be varied continuously or in steps by adjusting the relative amounts of the various components during deposition.

For example, to enhance adhesion of the deposited fluorine-containing material to the underlying substrate, the first 10–100 Å of deposited material can be made relatively rich in an element or composition that is known to adhere well to the underlying substrate by providing a mixture comprising a F-containing chemical precursor and a supplemental source. Preferably, the mixture is initially relatively rich in the supplemental source and relatively poor in the chemical precursor. The film can be graded by decreasing the relative amount of supplemental source during the next stage of the deposition to thereby deposit a relatively $CF_2$-rich portion that provides the resulting fluorine-containing material with a low dielectric constant. During the final 10–100 Å of the deposition, the relative amount of supplemental source can be increased again so that any layers subsequently deposited onto the fluorine-containing material will adhere well to its surface. The supplemental source chosen for the initial stage of the deposition can be the same or different from the supplemental source chosen for the final stage. Preferably, the supplemental sources are selected to provide an initial deposit that adheres well to the substrate and a final deposit that adheres well to the subsequently deposited layer, if any. For a silicon substrate or subsequent layer, supplemental sources include silane, and more preferably, disilane and trisilane. For a copper substrate or subsequent layer, preferred supplemental sources include dimethoxysilane and dimethyldimethoxysilane. For a silicon-carbon substrate or subsequent layer, preferred silicon sources include disilylmethane, trisilylmethane, and tetrasilylmethane. Furthermore, silicon-carbon substrate materials may also be preferably deposited using methylsilane, dimethylsilane, trimethylsilane or tetramethylsilane. Accordingly, graded fluorine-containing materials can be provided with good adhesion and low overall dielectric constant.

As another example, supplemental sources may be used to introduce elements that serve as crosslinking sites within the fluorine-containing material. For instance, in Scheme (II), the tetravalent Si atoms in $-[(SiH_2)-(CF_2)_x-(SiH_2)-(CF_2)_{100-x}]-$ are potential crosslinking sites because they can eliminate hydrogen to form bonds to other polymer chains. Supplemental silicon and germanium sources in which the silicon or germanium is bonded to more than two hydrogen atoms are preferred crosslinking agents because the Si—H or Ge—H bond(s) in the resulting fluorine-containing material can be easily broken to allow the Si or Ge atom to bond to more than one polymer chain. More preferred crosslinking agents are disilane, trisilane, methylsilane, digermane, trigermane, and methylgermane. Crosslinking agents are preferably used in an amount that is effective to crosslink the fluorine-containing material, more preferably at relatively low levels to avoid detrimental effects on other properties such as dielectric constant, even more preferably at a level of about 1% or less, most preferably about 0.5% or less, by weight based on weight of chemical precursor.

As another example, a supplemental oxygen source may be used to introduce porosity into the fluorine-containing material as discussed in greater detail below.

Among the supplemental sources, preferred silicon sources include silane, disilane, trisilane, methylsilane, dimethylsilane, disiloxane, dimethylsiloxane, methoxysilane, dimethoxysilane, and dimethyldimethoxysilane. Preferred germanium sources include germane, digermane, tri germane, methylgermane, dimethylgermane, methoxygermane and dimethoxygermane. Preferred carbon sources include methane, ethane, fluoromethane, perfluoroethane, silylmethane, disilylmethane, trisilylmethane, tetrasilylmethane, methylsilane, dimethylsilane, trimethylsilane and tetramethylsilane. Preferred oxygen sources include oxygen, nitrous oxide, ozone, carbon dioxide, carbon monoxide, hydrogen peroxide, water, methanol, ethanol, dimethylether, and diethyl ether. Preferred supplemental sources can be a source for two or more elements, e.g., dimethylether can be a source of both carbon and oxygen, dimethylsiloxane can be a source of carbon, oxygen and silicon, etc.

For some applications, it is sufficient to bring together the substrate and chemical precursor without the benefit of any kind of enclosure and deposit the fluorine-containing material under ambient conditions or under a flowing blanket of carrier gas. For instance, a continuous coating process can be conducted in which a substrate such as a glass fiber or plastic sheet is run under a set of heat lamps at a temperature sufficient to activate a chemical precursor that is directed to flow continuously over the substrate, thus depositing a F-containing film onto the fiber or sheet. To minimize contamination and produce a higher quality film, it is preferable to deposit the fluorine-containing material onto the substrate by disposing the substrate within a chamber and introducing the chemical precursor to the chamber. The chamber can be partially open during deposition, e.g., in the above example, the fiber or sheet can be run through an oven or furnace, or preferably the chamber can be closed during deposition.

Closed chambers are preferably used in the chemical vapor deposition (CVD) techniques that are preferably used to deposit the fluorine-containing material. A wide variety of CVD techniques are known to those skilled in the art. Plasma-enhanced chemical vapor deposition ("PECVD") and thermal chemical vapor deposition ("thermal CVD") are preferred, particularly for the deposition of dielectric films in microelectronics manufacturing. These techniques are widely used in the fabrication of integrated circuits, see, e.g., Stephen A. Campbell, "The Science and Engineering of Microelectronic Fabrication," Oxford University Press, New York (1996); Stanley Wolf and Richard N. Tauber, "Silicon Processing for the VLSI Era," Lattice Press, Sunset Beach, Calif. (2000).

In PECVD, plasma energy is used to activate the chemical precursor by applying an electromagnetic field, e.g., microwave or radio frequency energy, to the chemical precursor. The plasma may generated in the immediate vicinity of the substrate or in a remote location. Preferred substrate temperatures during deposition range from about minus 10° C. to about 450° C., more preferably about 0° C. to about 400° C. In the absence of a chamber, the flow of chemical precursor to the substrate can be controlled by employing a gas mixture and adjusting the partial pressure of the chemical precursor within the mixture. Preferably, a chamber is employed so that the flow of chemical precursor can also be controlled by manipulating the overall pressure, using a vacuum pump or similar device. The chemical precursor is preferably introduced at the inlet, and the chamber is preferably backfilled with carrier gas to control the total pressure. Preferred total pressures are in the range of about 0.001 torr to about 100 torr, preferably about 0.05 torr to about 25 torr. Preferred partial pressures of chemical precursor for PECVD are in the range of about 0.01 torr to about 20 torr, preferably about 0.05 torr to about 5 torr.

A preferred PECVD deposition technique utilizes a pulsed plasma (non-continuous wave) process, where the electromagnetic field is only applied during a portion of the activation and/or deposition process. This invention is not bound by theory, but it is believed that the pulsed PECVD technique maximizes the amount of $:CF_2$ generated and minimizes the formation of other CF-type species, and thus maximizes the $CF_2$ content of the resulting deposited fluorine-containing material. In a preferred pulsed plasma process, the length of each sequence is preferably in the range of about 5 milliseconds to about 500 milliseconds. More preferably, the electromagnetic field is applied for less than about 50% of the length of each sequence, i.e., less than 25 milliseconds out of each 50 milliseconds, less than about 250 milliseconds out of each 500 milliseconds, etc., and even more preferably applied for less than about 15% of the length of each sequence.

In thermal CVD, thermal energy is used to activate the chemical precursor by adjusting the temperature of the substrate and/or the chemical precursor, preferably by heating to a temperature in the range of about 150° C. to about 450° C., more preferably about 250° C. to about 450° C., even more preferably about 300° C. to about 400° C. In the absence of a chamber, the flow of chemical precursor to the substrate can be controlled by employing a gas mixture and controlling the partial pressure of the chemical precursor within the mixture. Preferably, a chamber is employed so that the flow of chemical precursor can also be controlled by manipulating the overall pressure, using a vacuum pump or similar device. The chemical precursor is preferably introduced at the inlet, and the chamber is preferably backfilled with carrier gas to control the total pressure. Preferred total pressures are in the range of about 0.1 torr to about 760 torr, more preferably about I torr to about 350 torr, and most preferably about I torr to about 100 torr. Preferred partial pressures of chemical precursor are in the range of about 0.01 torr to about 400 torr, more preferably about 0.1 torr to about 200 torr. In a particularly preferred embodiment, thermal CVD is used to deposit a crosslinked fluorine-containing material having a thickness in the range of 10 Å to about 5,000 Å onto a substrate disposed within a chamber at a temperature in the range of about −10° C. to about 450° C.

Suitable chambers for conducting PECVD are commercially available, and preferred models include the Eagle™ series of reactors commercially available from ASM Japan K.K., of Tokyo, Japan. Suitable chambers for conducting thermal CVD are also commercially available and include the Epsilon™ series of single wafer epitaxial reactors, such as the Epsilon2000®, commercially available from ASM America, Inc. of Phoenix, Ariz. Preferred models include the A400 series of batch tube reactors, such as the A400® and A412®, commercially available from ASM International N.V. of Bilthoven, The Netherlands. Commercially available CVD chambers are preferably equipped with a number of features, such as computer control of temperature, gas flow and switching, and chamber pressure, that can be manipulated to produce consistently high-quality films suitable for microelectronics applications. Those skilled in the CVD art are familiar with such methods and equipment, and thus routine experimentation may be used to select the appropriate conditions for depositing fluorine-containing materials using the chemical precursors described herein.

In a preferred embodiment, thermal CVD is used for deposition in a process that involves independently adjusting the temperature of the substrate and the activation temperature of the chemical precursor. The temperature of the substrate can be adjusted by methods known in the art, such as the use of heat lamps and/or by resistively heating the substrate. The chemical precursor can also be activated by heating it directly using various methods such as by providing it as a component of a heated carrier gas or by utilizing a heated inlet port e.g., a heated showerhead. In the absence of a statement to the contrary, the recitation herein of a specific deposition or activation temperature refers to the temperature of the substrate.

In a more preferred process, an Eagle™ 10 PECVD reactor (commercially available from ASM Japan K.K., of Tokyo, Japan) is used in a thermal mode, i.e., without the use of a plasma. The reactor is preferably equipped with a heated showerhead and a heated substrate such that the temperature of each can be adjusted independently. The chemical precursor is preferably activated by heating the substrate to a temperature in the range of about 100° C. to about 450° C., more preferably about 150° C. to about 400° C., while maintaining the temperature of the showerhead below the activation temperature of the chemical precursor, preferably in the range of about 30° C. to about 40° C. When hexafluoropropylene oxide is used as a chemical precursor, deposition onto a heated substrate is preferred. The chemical precursor can also be activated by heating the showerhead to a temperature in the range of about 100° C. to about 450° C., more preferably about 150° C. to about 450° C., and maintaining the temperature of the substrate at a temperature that is about 50° C. to about 300° C. cooler than the showerhead. Preferably, the substrate is maintained at a temperature in the range of about −10° C. to about 450° C., more preferably about 100° C. to about 400° C.

Various deposition methods can be used in conjunction with one another. For example, in another preferred embodiment, both remote PECVD and thermal CVD are used to deposit a fluorine-containing material which also contains silicon. In a more preferred aspect of this embodiment, a remote plasma is used to decompose silane, disilane or trisilane to provide a source of reactive Si-containing fragments. These fragments are then preferably directed to a thermal CVD chamber into which a chemical precursor, preferably $CF_3SiF_3$, is introduced. The chemical precursor is preferably activated directly, preferably by using a heated showerhead, at a temperature in the range of about 100° C. to about 450° C. Preferably, a substrate contained within the chamber is maintained at a temperature in the range of about 100° C. to about 450° C. Under these conditions, it is believed that a mixture of Si-containing fragments and $[:CF_2]$ is produced that deposits onto the substrate to form a preferred Si-containing, fluorine-containing material.

The representation of a fluorine-containing polymer herein by the use of a chemical formula having certain recurring units, e.g., "—$(CF_2)_n$—" in Scheme (I), "—$[(SiH_2)$—$(CF_2)_x$—$(SiH_2)$—$(CF_2)_{100-x}$—]" in Scheme (II), etc., is only exemplary and in practice the resulting polymer may contain a variety of recurring units, depending on the deposition conditions. In fact, a variety of fluorine-containing polymers can be produced, depending on such factors as the composition and amount of the chemical precursor(s), the presence or absence of additional compounds that provide a source of other elements, e.g., supplemental sources, activation conditions (temperature, presence or absence of plasma, etc.), deposition conditions (temperature, presence or absence of plasma, etc.), and the nature of the substrate. For many applications for which it is desirable to achieve the types of properties exhibited by PTFE, e.g., low dielectric constant, low friction, etc., it is preferred to utilize a high proportion of a chemical precursor such as $CF_3SiF_3$. Surprisingly, the use of $CF_3SiF_3$ has been found to result in fluorine-containing polymers which contain a high proportion of recurring $CF_2$ units, i.e., $—(CF_2)_n—$, even when the deposition conditions vary, as illustrated in the working examples provided below. Thus, the basic chemical structure of the deposited polymers appears to be primarily a function of the identity of the chemical precursors(s) and any supplemental sources. Preferred polymers comprise a high proportion of $CF_2$ groups as shown by infrared spectroscopy and X-ray photoelectron spectroscopy. Polymers comprising carbon and fluorine atoms are preferred which have a numerical ratio of fluorine atoms to carbon atoms, i.e. fluorine:carbon, in the range of about 1:1 to about 3:1, more preferably about 1.5:1 to about 2.5:1, even more preferably about 1.8:1 to about 2.2:1, as shown by elemental analysis.

The properties of fluorine-containing materials described herein can be controlled by varying the overall deposition conditions, preferably by controlling the type and amount of chemical precursor(s), the type and amount of additional elemental source (if any), the activation temperature, the substrate temperature, and the presence or absence of plasma. The effect of varying each of these parameters is discussed elsewhere herein. For instance, in the working examples provided below, it was found that thinner films having higher adhesion and higher transparency were formed at higher deposition temperatures, whereas thicker, more opaque films having lower adhesion were formed at lower temperatures, and films having intermediate properties were formed at intermediate deposition temperatures. Preferably, experimental design methods are used to determine the effect of the various process variables and combinations thereof on chemical composition and/or physical properties of the resulting films. Experimental design methods per se are well-known, see e.g., Douglas C. Montgomery, "Design and Analysis of Experiments," $2^{nd}$ Ed., John Wiley and Sons, 1984. For a particular process, after the effect of the various process variables and combinations thereof on chemical composition and/or physical properties has been determined by these experimental design methods, the process is preferably automated by computer control to ensure consistency in subsequent production.

The fluorine-containing materials described herein can be subjected to a variety of processes. For example, in the manufacture of integrated circuits, additional layers of other materials such as metal lines or semiconducting layers can be deposited onto the surface of a dielectric film formed as described herein. Such deposition can be conducted by providing a silicon source, metal source, germanium source, etc., and depositing the additional layer in the usual manner. Preferably, the adhesion of the additional layer is enhanced by including an adhesion-promoting supplemental element during the final stage of the deposition as described elsewhere herein.

The surface of the fluorine-containing material can be treated or modified by exposing it to a chemically reactive reagent, e.g., etching with a strong oxidizing agent such as an oxygen plasma or defluorinating with a strong reducing agent with the optional introduction of functional groups, see, e.g., C. A. Costello and T. J. McCarthy, "Introduction of Organic Functional Groups Onto the Surface of Poly (tetrafluoroethylene)," Proceedings of the ACS Division of Polymeric Materials Science and Engineering, Vol. 55. p 893 (1986).

A preferred embodiment provides a process for making a porous material. In a first aspect, the process is conducted by depositing an oxygen-containing film onto a substrate at a relatively low temperature, then heating the film to eliminate oxygen and combustion products of the oxygen with the combustible elements of the film, e.g., carbon. In a second aspect, the process is conducted by providing a oxygen source or oxidizing agent and a F-containing compound as described below and depositing a F-containing film onto a substrate at a relatively higher temperature, so that porosity in the film is created by combustion that occurs during the deposition process.

In both aspects, the film is preferably deposited by a deposition technique as described elsewhere herein, preferably by thermal CVD or PECVD, using an oxygen source as described elsewhere herein and an F-containing compound of the formula $(F_3C)_{4-m-n}MX_mR_n$, wherein M is Si or Ge; X is halogen; R is H or D; m is 0, 1, 2 or 3; and n is 0, 1, 2, or 3; with the proviso that $(m+n) \leq 3$. Preferred F-containing compounds include $(F_3C)SiH_3$, $(F_3C)_2SiH_2$, $(F_3C)SiD_3$, $(F_3C)_2SiD_2$, $(F_3C)SiFH_2$, $(F_3C)SiF_2H$, $(F_3C)SiF_3$, $(F_3C)SiFD_2$, $(F_3C)SiF_2D$, $(F_3C)GeH_3$, $(F_3C)_2GeH_2$, $(F_3C)GeF_3D$, $(F_3C)_2GeD_2$, $(F_3C)GeFH_2$, $(F_3C)GeF_2H$, $(F_3C)GeF_3$, $(F_3C)GeFD_2$, and $(F_3C)GeF_2D$. The F-containing compound and the oxygen source are preferably provided in the form of gases or as components of a gas, and the gas may comprise a carrier gas, a silicon source, a carbon source and/or a germanium source as described elsewhere herein.

When conducted according to the first aspect, the deposition of the oxygen source and the compound results in an oxygen-containing film that also contains fluorine atoms, preferably in the form of $CF_2$ groups. Deposition at lower temperatures is preferred, preferably by PECVD or thermal CVD, more preferably at a temperature of about 300° C. or less, even more preferably at a temperature in the range of about 200° C. to about 300° C. Deposition is preferably conducted in a chamber, even more preferably in a PECVD chamber or thermal CVD chamber as described elsewhere herein. In a preferred embodiment, the F-containing compound is $(F_3C)SiF_3$, the oxygen source is oxygen or ozone, and about 5 atomic percent or less of oxygen atoms are incorporated into the oxygen-containing film, more preferably about 1 atomic percent or less, based on the total elemental content of the oxygen-containing film.

For the first aspect, the porous film is preferably created by heating the oxygen-containing film to a temperature in the range of about 150° C. to about 400° C., preferably for a period of time that is effective to create the desired level of porosity in the film. More preferably, the heating is also effective to render the resulting film substantially free of oxygen, especially when the film is a dielectric film, because the presence of oxygen in the film tends to decrease the thermal stability of the thin film.

This invention is not bound by theory, but it is believed that the porosity results because oxygen within the film reacts with other combustible elements such as carbon to form gases such as carbon monoxide (CO) and carbon dioxide ($CO_2$), thus creating microcavities within the film where the carbon and oxygen atoms were previously located. Preferably, the oxygen-containing film is heated to a temperature that is higher than the glass transition temperature of the film, so that additional porosity is achieved as the gases expand within the softened film to form microbubbles. Higher levels of porosity within the film are preferred to provide the film with a lower dielectric constant. Preferably, the process of the first aspect is effective to provide the porous film with a dielectric constant that is at least 0.1 units less than the dielectric constant of the oxygen-containing film from which it is derived.

Deposition according to the second aspect is preferably conducted in a single, higher temperature step in which porosity-creating combustion occurs during deposition. This invention is not bound by theory, but it is believed that the oxygen source acts as an oxidizing agent during deposition to at least partially etch the surface of the film as it is being deposited. Deposition at higher temperatures is preferred, preferably by PECVD or thermal CVD, preferably at a temperature greater than about 300° C., even more preferably at a temperature in the range of about 350° C. to about 450° C. Deposition is preferably conducted in a chamber, even more preferably in a PECVD chamber or thermal CVD chamber as described elsewhere herein. In a preferred embodiment, the F-containing compound is $(F_3C)SiF_3$, the oxygen source or oxidizing agent is oxygen, ozone, carbon dioxide or carbon monoxide, and the ratio of F-containing compound to oxygen source, i.e., F-containing compound:oxygen source, is in the range of from about 10:1 to 20,000:1, preferably 50:1 to 10,000:1, by weight based on total weight. The resulting deposited film may contain oxygen, but is preferably substantially free of oxygen, especially when the film is a dielectric film, because the presence of oxygen in the film tends to reduce the thermal stability of the thin film material.

In both aspects, the degree of porosity tends to increase as the amount of available oxygen is increased. Too much oxygen can result in complete combustion of the film and therefore is to be avoided unless removal of the film is desired. Preferably, the porous film is a dielectric film having a dielectric constant of about 2.5 or lower, more preferably about 2.3 or lower, even more preferably about 2.1 or lower. A highly preferred porous film is crosslinked and has a dielectric constant of about 2.5 or lower. Frequently, the average thickness of the porous film is in the range of about 5 Å to about 15,000 Å, preferably about 10 Å to about 10,000 Å, more preferably about 10 Å to about 8,000 Å, most preferably about 100 Å to about 5,000 Å.

The oxygen-containing films and the porous films described herein can be subjected to a variety of processes. For example, in the manufacture of integrated circuits, additional layers of other materials such as metal lines or semiconducting layers can be deposited onto the surface of a dielectric film formed as described herein. Such deposition can be conducted by providing a silicon source, metal source, germanium source, etc., and depositing the additional layer in the usual manner. In a preferred embodiment, a silicon source is introduced to the chemical vapor deposition chamber and a Si-containing film is deposited onto the porous film.

Fluorinated materials are also useful in a number of other industries where they are recognized for their unique properties. Typical applications include coatings for biomedical devices, e.g., devices that are implanted into the body, coatings for non-stick cooking applications, coatings for moving parts such as bearings, computer hard disks and data tapes, antireflective coatings, and high performance coatings for protection from aggressive chemical environments encountered in the chemical processing industry, on satellites exposed to atomic oxygen, and in corrosive marine applications. The processes described herein can be used to deposit fluorinated materials onto substrates that are used in these applications and in other applications where the unique properties of these materials provide a benefit.

It will be understood by those of skill in the art that numerous and various modifications can be made without departing from the spirit of the present invention. Therefore, it should be clearly understood that the various embodiments discussed above and described in the examples below are illustrative only and are not intended to limit the scope of the present invention.

EXAMPLES

Examples 1–7

A quartz tube having a gas inlet and outlet and enclosed by a resistively heated tube furnace was attached to a source of $CF_3SiF_3$. Seven silicon workpieces were placed along the length of the tube. A portion of the furnace was heated to a temperature of about 350° C., creating a hot zone near the inlet end and producing a temperature gradient along the remaining length of the furnace ranging from about 350° C. in the hot zone to about 30° C. at the outlet. The furnace temperature in the vicinity of each workpiece during deposition was measured with a thermocouple and is shown in Table 1. The $CF_3SiF_3$ chemical precursor was introduced to the inlet at a pressure of about 3 torr and a flow rate of about 10–15 standard cubic centimeters per minute ("sccm"), while backfilling with nitrogen to keep the pressure reasonably constant. The $CF_3SiF_3$ was thermally activated as it flowed along the length of the furnace to the outlet, thereby depositing films on each of the workpieces.

The chemical structures for the films deposited onto each of the workpieces were characterized by infrared spectroscopy and x-ray photoelectron spectroscopy ("XPS"). The $CF_2$ content for some of the films reported in Table 1 was estimated by measuring the area under the 292 eV peak of the carbon 1s XPS spectrum. The $CF_2$ content of the remainder of the films was estimated through direct comparison of the infrared spectra of these films with that of the films also measured using XPS. Additional observations regarding the films are reported in Table 1.

Outlet gases were trapped with liquid nitrogen and analyzed. The primary gases recovered were $SiF_4$ and tetrafluoroethylene. A trace quantity of $CF_3SiF_3$ was also detected (<1%).

These results show that $CF_3SiF_3$ is thermally activated to yield $CF_2$ fragments that are very reactive and capable of depositing thin film materials over a range of substrate temperatures, as well as recombining with one another to yield tetrafluroethylene as a gaseous byproduct. The degree of precursor activation is directly related to the length of the hot zone, as well as the temperature of the hot zone, as evidenced by the different types of films that were deposited under different experimental conditions for several series of reactions. A representative example of the types of films deposited is summarized in Table I.

For these experimental conditions, it was observed that workpieces maintained at the temperature of the hot zone were coated in thin, transparent films with excellent adhesion. FTIR spectra of these films reveal a structure consistent with that of $(CF_2)_n$. For work pieces maintained at ~300° C., and that were further from the gas inlet, thicker films were observed adhering to the substrates. These films also exhibited FTIR spectra that are consistent with a $(CF_2)_n$ structure. Workpieces maintained at about 280° C., that were not directly in the resistively heated zone of the furnace, were coated with opaque, brown-tinted films that were on the order of microns thick. These films were comprised of two layers. The top of the films was observed to be loosely adherent and could be removed via a tape test, while an adherent underlayer that was closest to the substrate was observed to be resistant to removal via tape tests. FTIR spectra of these films are identical to those observed from films deposited directly within the resistively heated portion of the tube furnace. This suggests that gas phase nucleation is contributing to later stages of film deposition, resulting in polymeric materials that have molecular weight different from that of films deposited directly within the hot zone. Workpieces maintained at temperatures from about 200° C. to about 140° C. were coated with thin, loosely adherent films that exhibited thickness fringe effects closest to the substrate, and that also had an overlayer of opaque, white films that were easily removed via tape test. The FTIR spectra of these films were identical to those obtained from films deposited on work pieces within the hot zone. Workpieces maintained at about 35° C. were coated with films quite similar to those observed on work pieces maintained at about 200° C. to about 140° C., but they were observed to be much thinner. FTIR spectra of these films were identical to those obtained from films deposited on work pieces within the hot zone.

TABLE 1

| No. | Temp., ° C. | % $CF_2$ | k | Comments |
|---|---|---|---|---|
| 1 | 350 | >98 | | Very thin, transparent, adherent films that were resistant to removal via tape tests |
| 2 | 350 | >95 | | Very thin, transparent, adherent films that were resistant to removal via tape tests |
| 3 | ~325 | >95 | | Colored (from interference fringing effects), films that appear dense and are resistant to removal via multiple tape tests |
| 4 | ~280 | >95 | | Very thick, brown-tinted, opaque films comprised of two layers. Top layer is removed via multiple tape tests, bottom layer remains after multiple tape tests. |
| 5 | ~200 | >95 | | Thick, opaque films comprised of white overlayer that is easily removed via tape tests and thinner underlayer that is resistant to removal via tape tests |
| 6 | ~140 | >95 | | Similar in appearance and properties to films deposited at ~200° C. |
| 7 | ~35 | >95 | | Similar in appearance and properties to films deposited at ~200° C., but thinner |

Example 8

A graded dielectric film is deposited by thermal CVD using an ASM A400® batch reactor system. A silicon wafer contained in the chamber is heated to a substrate temperature of 450° C. Trisilane is introduced to the chamber via a hydrogen bubbler at a flow rate of about 180 sccm for about 30 seconds to deposit an amorphous silicon layer having a thickness of about 10 Å on the silicon wafer. The flow rate of trisilane is then ramped down to 0.2 sccm while simultaneously ramping up the flow rate of $CF_3SiF_3$ over the course of 1 minute to deposit onto the amorphous silicon layer about 60 Å of a crosslinked, graded layer that contains both silicon and fluorine. Deposition is then continued for about 10 minutes at a $CF_3SiF_3$:trisilane ratio of about 100:1 to deposit about 2500 Å of a crosslinked film having a $CF_2$ content of about 95% and a dielectric constant of about 2.3. The film shows good adhesion to the silicon substrate.

Example 9

A graded film is deposited onto a silicon substrate using $CF_3SiF_3$ and trisilane as described in Example 8, except that the film is deposited at about 100° C. by pulsed PECVD using an ASM Eagle 10 PECVD reactor. The pulse sequence is 10 milliseconds on, 200 milliseconds off and the power level is 13.56 MHz. The introduction sequence for $CF_3SiF_3$ and trisilane is modified relative to Example 8 to deposit a film having approximately the same thickness for each stage. The resulting crosslinked film has a $CF_2$ content of about 85% and a dielectric constant of about 2.2, and shows good adhesion to the silicon substrate.

Example 10

A graded film is deposited onto a silicon substrate using $CF_3SiF_3$ and trisilane using the PECVD reactor as described in Example 9, except that a plasma was not used for deposition. Trisilane was decomposed in a remote plasma chamber and introduced into the main chamber at a substrate temperature of about 100° C. to deposit an amorphous silicon layer having a thickness of about 20 Å on the silicon wafer. A graded layer is then deposited by introducing $CF_3SiF_3$ through a showerhead heated to about 370° C. at an initial flow rate of about one sccm that is ramped up to 20 sccm during a corresponding rampdown of the trisilane flow rate. The rampup/rampdown takes about 3 minutes. Deposition is then continued for about 12 minutes to deposit a crosslinked film. The overall layer structure of the film is similar to Examples 8 and 9, but it has a $CF_2$ content of about 90% and a dielectric constant of about 2.2. It also shows good adhesion to the silicon substrate.

I claim:

1. A process for depositing a material onto a surface, comprising providing a substrate;

providing a chemical precursor of the formula $(F_3C)_{4-m-n}MX_mR_n$, wherein M is Si or Ge; X is halogen; R is H or D; m is 0, 1, 2 or 3; and n is 0, 1, 2, or 3; with the proviso that (m+n)≦3; and activating said chemical precursor to thereby deposit a fluorine-containing material onto said substrate.

2. The process as claimed in claim 1 wherein said chemical precursor is selected from the group consisting of $(F_3C)SiH_3$, $(F_3C)_2SiH_2$, $(F_3C)SiD_3$, $(F_3C)_2SiD_2$, $(F_3C)SiFH_2$, $(F_3C)SiF_2H$, $(F_3C)SiF_3$, $(F_3C)SiFD_2$, $(F_3C)SiF_2D$, $(F_3C)SiClF_2$, $(F_3C)SiCl_2F$, and $(F_3C)SiCl_3$.

3. The process as claimed in claim 1 wherein said chemical precursor is $(F_3C)SiF_3$.

4. The process as claimed in claim 1 wherein said chemical precursor is selected from the group consisting of $(F_3C)GeH_3$, $(F_3C)_2GeH_2$, $(F_3C)GeD_3$, $(F_3C)_2GeD_2$, $(F_3C)GeFH_2$, $(F_3C)GeF_2H$, $(F_3C)GeF_3$, $(F_3C)GeFD_2$, and $(F_3C)GeF_2D$.

5. The process as claimed in claim 1 wherein said fluorine-containing material is a film having a dielectric constant of about 2.7 or lower.

6. The process as claimed in claim 1 wherein said substrate is an integrated circuit.

7. The process as claimed in claim 1 further comprising providing a silicon source.

8. The process as claimed in claim 7 wherein said silicon source is selected from the group consisting of silane, disilane, trisilane, methylsilane, dimethylsilane, disiloxane, dimethylsiloxane, methoxysilane and dimethoxysilane.

9. The process as claimed in claim 8 wherein said silicon source is provided in an amount effective to crosslink said fluorine-containing material.

10. The process as claimed in claim 1 further comprising providing a germanium source.

11. The process as claimed in claim 10 wherein said germanium source is selected from the group consisting of germane, digermane, trigermane, methylgermane, dimethylgermane, methoxygermane and dimethoxygermane.

12. The process as claimed in claim 11 wherein said germanium source is provided in an amount effective to crosslink said fluorine-containing material.

13. The process as claimed in claim 1 further comprising providing an oxygen source.

14. The process as claimed in claim 13 wherein said oxygen source is selected from the group consisting of oxygen, nitrous oxide, ozone, hydrogen peroxide, water, methanol, ethanol, dimethylether, and diethyl ether.

15. The process as claimed in claim 1 further comprising providing an oxygen source and a silicon source.

16. The process as claimed in claim 1 further comprising providing an oxygen source and a germanium source.

17. The process as claimed in claim 1 wherein said substrate is disposed within a chamber.

18. The process as claimed in claim 17 further comprising providing an oxidizing agent and depositing a porous fluorine-containing material.

19. The process as claimed in claim 18 wherein said porous fluorine-containing material has a dielectric constant of about 2.3 or lower.

20. The process as claimed in claim 17 wherein said chamber is a batch tube reactor.

21. The process as claimed in claim 17 wherein said fluorine-containing material is deposited by thermal chemical vapor deposition.

22. The process as claimed in claim 21 wherein said fluorine-containing material is deposited by thermal chemical vapor deposition at a temperature in the range of about 150° C. to about 450° C.

23. The process as claimed in claim 22 wherein said fluorine-containing material is a polymer film having a thickness in the range of about 10 Å to about 10,000 Å.

24. The process as claimed in claim 1 wherein said fluorine-containing material is a polymer comprising carbon and fluorine atoms and having a numerical ratio of fluorine:carbon in the range of about 1.5:1 to about 2.5:1.

25. The process as claimed in claim 1 wherein said fluorine-containing material is deposited by plasma-enhanced chemical vapor deposition.

26. The process as claimed in claim 25 wherein said fluorine-containing material is deposited by pulsed plasma-enhanced chemical vapor deposition.

27. The process as claimed in claim 1 further comprising providing a silicon source and depositing a Si-containing film onto said fluorine-containing material.

28. A chemical vapor deposition process for depositing a dielectric film onto a surface, comprising
providing a chemical vapor deposition chamber having disposed therein a substrate;
introducing a gas to said chamber, wherein said gas comprises a chemical precursor selected from the group consisting of $(F_3C)SiH_3$, $(F_3C)_2SiH_2$, $(F_3C)SiD_3$, $(F_3C)_2SiD_2$, $(F_3C)SiFH_2$, $(F_3C)SiF_2H$, $(F_3C)SiF_3$, $(F_3C)SiFD_2$, and $(F_3C)SiF_2D$; and
reacting said chemical precursor to deposit onto said substrate a film having a dielectric constant of about 2.7 or lower.

29. The process as claimed in claim 28 wherein said film is deposited by thermal chemical vapor deposition at a temperature in the range of about 150° C. to about 450° C.

30. The process as claimed in claim 28 wherein said chemical precursor is $(F_3C)SiF_3$.

31. The process as claimed in claim 28 wherein said film is deposited by plasma chemical vapor deposition.

32. The process as claimed in claim 31 wherein said film is deposited by pulsed plasma chemical vapor deposition.

33. The process as claimed in claim 28 wherein said gas further comprises a supplemental source selected from the group consisting of oxygen source, silicon source, and germanium source.

34. The process as claimed in claim 33 wherein said gas further comprises a silicon source in an amount effective to crosslink said film.

35. The process as claimed in claim 28 wherein said substrate is an integrated circuit.

36. The process as claimed in claim 35 wherein said film is a polymer comprising carbon and fluorine atoms and having a numerical ratio of fluorine:carbon in the range of about 1.8:1 to about 2.2:1.

37. A process for: making a porous material, comprising
providing an oxygen source;
providing a compound of the formula $(F_3C)_{4-m-n}MX_mR_n$, wherein M is Si or Ge; X is halogen; R is H or D; m is 0, 1, 2 or 3; and n is 0, 1, 2, or 3; with the proviso that $(m+n) \leq 3$;
providing a substrate;
activating said oxygen source and said compound at a temperature of about 300° C. or less to thereby deposit an oxygen-containing film onto said substrate; and
heating said oxygen-containing film to a temperature in the range of about 150° C. to about 400° C. to form a porous film.

38. The process as claimed in claim 37 wherein said oxygen-containing film is deposited by thermal chemical vapor deposition at a temperature in the range of about 200° C. to about 300° C.

39. The process as claimed in claim 37 wherein said oxygen-containing film is deposited by plasma-enhanced chemical vapor deposition.

40. The process as claimed in claim 37 wherein said compound is selected from the group consisting of $(F_3C)SiH_3$, $(F_3C)_2SiH_2$, $(F_3C)SiD_3$, $(F_3C)_2SiD_2$, $(F_3C)SiFH_2$, $(F_3C)SiF_2H$, $(F_3C)SiF_3$, $(F_3C)SiFD_2$, $(F_3C)SiF_2D$, $(F_3C)GeH_3$, $(F_3C)_2GeH_2$, $(F_3C)GeD_3$, $(F_3C)_2GeD_2$, $(F_3C)GeFH_2$, $(F_3C)GeF_2H$, $(F_3C)GeF_3$, $(F_3C)GeFD_2$, and $(F_3C)GeF_2D$.

41. The process as claimed in claim 37 wherein said compound is $(F_3C)SiF_3$.

42. The process as claimed in claim 37 wherein said porous film has a dielectric constant of about 2.3 or lower.

43. The process as claimed in claim 37 further comprising providing a supplemental source selected from the group consisting of silicon source, germanium source, and oxygen source.

44. The process as claimed in claim 37 wherein said substrate is contained within a chemical vapor deposition chamber.

45. The process as claimed in claim 44 further comprising introducing a silicon source to said chemical vapor deposition chamber and depositing a Si-containing film onto said oxygen-containing film.

46. The process as claimed in claim 44 which further comprises introducing a silicon source to said chemical vapor deposition chamber and depositing a Si-containing film onto said porous film.

47. The process as claimed in claim 44 wherein said porous film is crosslinked and has a dielectric constant of about 2.5 or lower.

\* \* \* \* \*